United States Patent
Bhatt et al.

(10) Patent No.: US 7,596,863 B2
(45) Date of Patent: Oct. 6, 2009

(54) METHOD OF PROVIDING A PRINTED CIRCUIT BOARD WITH AN EDGE CONNECTION PORTION AND/OR A PLURALITY OF CAVITIES THEREIN

(75) Inventors: Ashwinkumar C. Bhatt, Endicott, NY (US); Robert J. Harendza, Lisle, NY (US); Robert M. Japp, Vestal, NY (US)

(73) Assignee: Endicott Interconnect Technologies, Inc., Endicott, NY (US)

( * ) Notice: Subject to any disclaimer, the term of this patent is extended or adjusted under 35 U.S.C. 154(b) by 364 days.

(21) Appl. No.: 11/652,633

(22) Filed: Jan. 12, 2007

(65) Prior Publication Data

US 2008/0168651 A1   Jul. 17, 2008

(51) Int. Cl.
*H05K 3/36* (2006.01)
(52) U.S. Cl. .............................. 29/852; 29/830; 29/831; 29/829; 29/854; 29/832; 439/637; 439/67; 439/65; 439/77; 439/60; 174/254; 174/257; 174/258; 174/264
(58) Field of Classification Search .................. 29/830, 29/852, 831, 829, 847, 832, 834; 174/254, 174/257, 258, 264; 439/60, 637
See application file for complete search history.

(56) References Cited

U.S. PATENT DOCUMENTS

| | | | |
|---|---|---|---|
| 4,026,627 A | 5/1977 | Benasutti | |
| 4,872,851 A | 10/1989 | Babuka et al. | |
| 5,309,629 A | 5/1994 | Traskos et al. | |
| 5,939,789 A | 8/1999 | Kawai et al. | |
| 6,109,939 A | 8/2000 | Kondo et al. | |
| 6,634,561 B1 | 10/2003 | Wallace | |
| 6,688,897 B2 | 2/2004 | Korsunsky et al. | |
| 6,818,168 B2 | 11/2004 | Morales | |
| 6,899,546 B2 | 5/2005 | Longueville et al. | |
| 6,966,482 B2 | 11/2005 | Totani et al. | |
| 6,986,917 B2 | 1/2006 | Takada et al. | |
| 7,036,214 B2 | 5/2006 | Kondo et al. | |
| 7,048,547 B2 | 5/2006 | Gottwald | |
| 7,084,355 B2 | 8/2006 | Kosaka et al. | |
| 7,147,480 B2 | 12/2006 | Ikeda | |

*Primary Examiner*—Derris H Banks
*Assistant Examiner*—Dan D Le
(74) *Attorney, Agent, or Firm*—Hinman, Howard & Kattell; Mark Levy; Lawrence R. Fraley

(57) ABSTRACT

A method of making a printed circuit board in which at least three substrates are aligned and bonded together (e.g., using lamination). Two of the substrates have openings formed therein, with each opening including a cover member located therein. During lamination, the cover members for a seal and prevent dielectric material (e.g., resin) liquefied during the lamination from contacting the conductive layers on the opposed surfaces of the inner (first) substrate. A PCB is thus formed with either a projecting edge portion or a plurality of cavities therein such that electrical connection may be made to the PCB using an edge connector or the like.

10 Claims, 4 Drawing Sheets

METHOD OF PROVIDING A PRINTED CIRCUIT BOARD WITH AN EDGE CONNECTION PORTION AND/OR A PLURALITY OF CAVITIES THEREIN

TECHNICAL FIELD

This invention relates to printed circuit boards and particularly to multilayered printed circuit boards including a plurality of dielectric and conductive layers as part thereof. More particularly, the invention relates to such boards which are adapted for having an edge connector positioned thereon and coupled thereto.

BACKGROUND OF THE INVENTION

As part of the manufacture of printed circuit boards (hereinafter also referred to as PCB's), it has become commonplace to form printed circuitry on one or both sides of a planar rigid or flexible insulating substrate. Of increased importance today is the manufacture of multilayer printed circuits, the most common types of boards sold today in view of increased operational demands for the products, e.g., personal computers, mainframes and servers, in which such boards are implemented. In these structures the board typically consists of parallel, planar, alternating inner layers of insulating dielectric material and conductive metal. Examples of the dielectric material include fiberglass-reinforced epoxy resin (also referred to in the field as, simply, "FR4"), polytetrafluoroethylene (e.g., Teflon, a trademark of E.I. DuPont de Nemours & Company), Driclad (a trademark of the Assignee of this invention, Endicott Interconnect Technologies, Inc.), etc. Since the dielectric substrate is nonconductive, in order to plate onto the substrate, the substrate is typically "seeded" and plating then occurs. Such processing, one example involving use of photolithography, is well known in the field, further description being provided below. Metals used in such processing include include copper, nickel and gold.

The selected number of layers, including both conductive and dielectric, are laminated using conventional pressures and temperatures to form the multilayered structure. The exposed outer surfaces (top and bottom) of the laminated structure are typically provided with one or more circuit patterns. The metal inner layers also typically contain circuit patterns, except in the case of internal power planes which are substantially solid, albeit also containing clearance openings or other openings if desired. Such internal layers are formed to include such circuit patterns prior to the lamination step, and often such formed layers in turn form part of a "subassembly" of one or more conductive-dielectric layer members, also known as a "core." These cores in turn may be referred to as "power" cores (if the conductive layer is to form a power plane), or by other abbreviated terminology such as "2S1P", meaning the core includes two signal planes and one power plane (with the appropriate number of dielectric layers to provide insulation, of course). Each multilayered final board may include several cores, in addition to other layers such as "sticker sheets' designed to bond one or more cores together.

In double-sided and multilayer printed circuit boards, it is often necessary to provide conductive interconnections between the various conductive layers of the board. This is commonly achieved by providing metallized, conductive "thru holes" in the board which communicate with the layers requiring electrical interconnection. For some applications, it is desired that electrical connection be made with almost if not all of the conductive layers. In such a case, thru-holes are also typically provided through the entire thickness of the board, in which case these are referred to as "plated thru holes." For these, as well as other applications, it is often desired to also provide electrical connection between the circuitry on one face of the board and to a depth to one or more of the inner circuit layers. These are referred to as "blind vias", which pass only part way through the board, as stated. In still another case, such multilayered boards often require internal "vias" which are located entirely within the board's structure and covered by external layering, including both dielectric and conductive. Such internal "vias", also referred to as "buried vias" are typically formed within a sub-part structure of the final board (such as the aforementioned "core") and then combined with other layers during final lamination of the board. For purposes of this application, the terms "conductive thru hole" is meant to include all three types of such holes.

To provide the desired circuit patterns for the board, including both internal and external, those in the art have developed a variety of manufacturing sequences, many of which fall into the broad categories of "subtractive" or "additive" techniques. Common to subtractive processes is the need to etch away (or subtract) metal to expose substrate surface in areas where no circuitry is desired. Additive processes, on the other hand, begin with exposed substrate surfaces (or thin commoning metallization layers for additive electroplate) and build up metallization in desired areas, the desired areas being those not masked by a previously-applied pattern of plating resist material (e.g., also called photo-resist in the printed circuit board field).

Typically, thru-holes are drilled (including mechanically or more recently using lasers) or punched into or through the board, as well as within the cores or other sub-parts, if desired, at selected locations. Drilling or punching provides newly-exposed surfaces including hole barrel surfaces and hole peripheral entry surfaces. The dielectric substrate, and the core or sub-part, if used, each comprising a top surface, a bottom surface, and at least one exposed internal hole surface consisting partly or entirely of the dielectric insulating material, is then metallized, generally by utilization of electro-less metal depositing techniques, albeit other deposition processes are also known in the field.

In addition to the above processes, some PCB's must also be designed to accommodate what are commonly referred to as edge connectors. Various types of edge connectors are known in the art and are designed typically for being secured to a corresponding edge of the PCB in order to be electrically coupled to a pattern of circuit elements (e.g., elongated pads) formed thereon. Some edge connectors may be secured to the PCB edge using such members as pins which extend within corresponding edge openings, while a more common form of edge connector is designed for simply being frictionally positioned onto the projecting end of the edge portion. This latter form of connector usually includes therein a plurality of contact elements, e.g., curved blade spring contacts, which slidably engage respective ones of the elongated pads on the board edge during positioning. The result is a strong frictional fit, such that the connector may be later removed for repair, including when repair is desired for the PCB itself This fit also enables facile replacement of the connector. It is also possible to fit more than one edge connector onto a single PCB, including on more than one edge portion thereof. As understood from the following, the present invention is specifically directed to the formation of a multilayered PCB with the ability to make sound and facile connection to an edge connector.

The following patents describe various approaches to manufacturing printed circuit boards, including those with extending edge portions designed to accommodate edge connectors such as those described above. Examples of such edge connectors are also shown in some of the patents below.

In U.S. Pat. No. 7,147,480, there is described an approach for connecting a flexible printed circuit board to a conventional (non-flexible) printed circuit board. Patterns on both boards are aligned and connected with each other by soldering. An elongated hole is formed in the vicinity of and along the edge portion in a connecting part of the printed circuit board, and two rectangular holes communicating with the elongated hole are formed at both longitudinal ends of the elongated hole, while two notches for controlling insertion depth are provided at opposing ends of the connecting edge of the flexible printed circuit board. The leading edge portion of the flexible printed circuit board, which is left between the cut portions, is bent downward, and the bent portion is inserted into the elongate hole and the rectangular holes of the printed circuit board to position the flexible printed circuit board, and then the patterns, respectively located on the flexible printed circuit board and the printed circuit board, are connected by soldering.

In U.S. Pat. No. 7,084,355, there is described a multilayer printed circuit board in which micro-cracks or metallic migration is mitigated when a Resin Fill Plated Through Hole (RFP) is arranged near the edge thereof. The multilayer printed circuit board includes an inner layer having an RFP, outer layers, RFP lands, and conductor layers. The conductor layers are positioned over the RFP lands and the outer edges of the conductor layers extends outward further than the outer edges of the RFP lands. When the multilayer printed circuit board is heated, a stress is generated in and near the RFP. The conductor layers positioned so as to cover the RFP lands, exert a reaction against the stress to suppress generation of micro-cracks in the multilayer printed circuit board and thereby mitigate metallic migration in the board.

In U.S. Pat. No. 7,048,547, there is described a printed-circuit board which is formed with a front edge having a cutout. A plug is provided with a base body adapted to fit in the cutout and formed with a pair of shoulders bearing flatly on the board at edges of the cutout. A pair of wing-shaped connecting elements project oppositely from the body and lie flatly on the board adjacent the edges of the cutout so that the elements can be soldered to the board to fix the base body in the cutout.

In U.S. Pat. No. 7,036,214, there is described a method of manufacturing a rigid-flexible printed circuit board in which slits for defining two sides of a removing portion are formed in a part of plural resin films, and the plural resin films are stacked and bonded to form a circuit board. Then, a product portion is cut from the circuit board. Before the bonding, a separation sheet is disposed between predetermined adjacent layers of the plural resin films to separate the removing portion from a residual portion of the product portion. Accordingly, while the product portion is cut from the circuit board, the removing portion is separated from the product portion, because the removing portion are defined by the separation sheet, the slits, and a cutting outline of the product portion.

In U.S. Pat. No. 6,966,482, there is described the formation of lands formed on a flexible printed circuit board which are electrically connected with lands formed on a rigid printed circuit board through solder. At this point, solder resist is formed between neighboring two lands on the rigid printed circuit board, and is terminated with a projecting end portion that is interposed between the rigid printed circuit board and the flexible printed circuit board. Accordingly, when surplus solder is extruded onto the rigid printed circuit board, the solder resist can prevent solder bridges from being formed between the lands.

In U.S. Pat. No. 6,986,917, there is described the printing of a solder resist comprising a thermosetting resin on a surface of an insulating board having a conductor circuit. The solder resist is then heat-cured to form an insulating film having a low thermal expansion coefficient. A laser beam is then applied to the portion of the insulating film in which an opening is to be formed, to burn off the same portion for forming an opening, whereby the conductor circuit is exposed. This opening may be formed as a hole for conduction by forming a metal plating film on an inner surface thereof. An external connecting pad is formed to cover the opening. The film of coating of a metal is formed by using an electric plating lead, which is preferably cut off by a laser beam after the electric plating has finished.

In U.S. Pat. No. 6,899,546, there is described a printed circuit board which is provided with an attachment which surrounds surface contacts of the printed circuit board that are to be contacted by a printed circuit board connector that covers the portion of the printed circuit board and edges of the printed circuit board around the surface contacts and includes recesses corresponding to the surface contacts assuring proper connection with contacts of a printed circuit board connector.

In U.S. Pat. No. 6,818,168, there is described a method that puts a pair of bevels onto an edge of a printed circuit board so that the PCB can be inserted into an expansion slot of a computer. The tool has a bevel wheel, preferably with a bi-laterally symmetrical angle channel shape, that is connected to a carriage. The bevel wheel rolls along the carriage while the bevel wheel is pressed onto the edge of the PCB so as to form the pair of bevels on the edge of the PCB. No material is removed from the PCB while forming the pair of bevels. The bevel wheel is forced upon the edge using a piston that monitors and regulates the pressure applied to the edge of the PCB in order to achieve a preferred height and angular orientation of the pair of bevels.

In U.S. Pat. No. 6,688,897, there is described an electrical edge connector designed for being straddle-mounted on an edge of a printed circuit board and which includes an insulating housing having an elongated groove for mating. A support subassembly is inserted from the opposing side of the housing to expose its portions in the groove.

In U.S. Pat. No. 6,634,561, there is described a small, flat rectangular shaped electronic circuit card, such as one containing non-volatile memory, which has a row of contacts mounted on bottom surfaces of a row of recesses extending along a short edge of the card and an adjacent angled corner. At least one of the recesses opens to the angled corner and the remaining recesses open to the short edge. Two surface contacts are included in at least one of the recesses, while the remaining recesses each contain a single contact.

In U.S. Pat. No. 6,109,939, there is described a memory card which has a card body having a concavity formed at the forward end thereof in the inserting direction and in which terminals are disposed and projections are formed between the terminals to prevent the terminals from being touched or accessed from outside. A receptacle for the memory card is also disclosed. The memory card has a simple structure designed to positively protect the terminals and easily let out dust or the like from inside, thereby permitting to assure a positive connection with the receptacle.

In U.S. Pat. No. 5,939,789, there is described a multilayer substrate which is fabricated by laminating a plurality of substrates, each comprising an insulation film, a plurality of via holes which pass through the upper surface to the lower surface of the insulation film, a wiring which is provided on the upper surface of the insulation film and the upper surface of the via holes and electrically connected with the via holes, a bonding member which is provided on the lower surfaces of the via holes and electrically connected with the via holes, and a bonding layer which is provided on the upper surface of the insulation film where the wiring is formed and the method of fabrication thereof whereby large costs reduction and high density effect are alleged to be obtained.

In U.S. Pat. No. 5,309,629, methods of fabricating multi-layer circuits are presented. In this patent, a plurality of circuit layers is stacked, one on top of the other. At least one of the circuit layers comprises a substrate composed of a polymeric material capable of undergoing bonding such as a fluoro-polymeric based substrate having vias there-through and a circuit comprised of a layer of suitable conductive material. A fusible conductive bonding material (e.g., solder) or a noble metal is applied wherever electrical connections are desired. At least one other of the circuit layers comprises a polyimide circuit (or other high temperature non-fusing polymer circuit, with or without filler or fabric reinforcement) having vias and circuits comprised of a layer of suitable conductive material with a fusible conductive bonding material (e.g., solder) or a noble metal applied wherever electrical connections are desired. Once stacked the circuits are subjected to lamination under heat and pressure to adhere each polymeric substrate to an adjacent polyimide substrate and to diffuse the noble metal or fuse the solder layers together to form an integral multi-layer circuit having solid conductive interconnects.

In U.S. Pat. No. 4,872,851, there is described an edge electrical connector for providing electrical connection to contact elements on a printed circuit board wherein torsional contacts are utilized. The contacts, actuated by a vertically moving, slidable member (e.g., a cam plate) and horizontally moving actuator (e.g., a linear cam), resume a normal, twisted configuration to effect such connection with the respective contact elements. Each contact, preferably metallic (e.g., beryllium copper), includes a curvilinear edge segment while each contact element (e.g., plated copper wire) in turn includes a curvilinear contacting surface, these two members thus providing a single point form of contact while assuring effective wiping motion to remove undesirable contaminants, debris, etc. which may be located thereon.

In U.S. Pat. No. 4,026,627, there is described an edge connector with an electrical contact including an angular engagement arm for slidably engaging a conductive surface (a pad on a PCB edge), said arm including a noble metal segment thereon for electrically contacting the surface and means for preventing transfer of material from the arm onto the noble segment. The improvement resides within the material transfer prevention means wherein the means comprises at least one elongated blade having at least one edge thereon, the blade formed so that only the edge slidably engages the conductive surface prior to the noble metal segment contacting the surface.

The present invention represents a new and unique method of forming a PCB with at least one edge portion adapted for accommodating an edge connector which, when securely positioned, will be electrically coupled to one or more conductors (e.g., elongated pads) on the PCB's edge. This method is accomplished in such a manner so as to prevent the incursion of dielectric material or the like onto the conductors during lamination of two or more of the PCB's substrates in formation of the PCB. It is also possible to form cavities within the PCB to expose the conductors for subsequent coupling to an edge connector or the like. It is believed that such a method will constitute a significant advancement in the art.

OBJECT AND SUMMARY OF THE INVENTION

It is, therefore, a primary object of the present invention to enhance the printed circuit board art by providing a new and unique method of producing such boards.

It is another object of the invention to provide such a process which may be performed using conventional PCB equipment and processes, thus representing a savings in manufacturing costs.

It is still another object of the invention to provide such a method which produces a projecting edge portion of the board which is facilely able to accept an edge connector thereon and provide sound electrical connection thereto.

According to one aspect of the invention, there is provided a method of making a printed circuit board which comprises the steps of providing a first circuitized substrate including at least one dielectric layer having first and second opposing surfaces, and first and second opposing conductive layers positioned on the first and second surfaces of the at least one dielectric layer, respectively, providing second and third circuitized substrates each including at least one dielectric layer and at least one conductive layer, forming first and second openings within these second and third circuitized substrates, respectively, positioning first and second cover members within the openings within the second and third circuitized substrates, respectively, aligning the first, second and third circuitized substrates relative to one another with the first opening of the second circuitized substrate having the first cover member therein facing the first opposing surface of the first circuitized substrate and the second opening of the third circuitized substrate having the second cover member therein facing the second opposing surface of said the circuitized substrate, bonding the first, second and third circuitized substrates together, and thereafter removing the first and second cover members and portions of the second and third circuitized substrates to define a projecting edge portion of the first circuitized substrate, the first, second and third circuitized substrates forming a printed circuit board.

According to another aspect of the invention, there is provided a method of making a printed circuit board which comprises the steps of providing a first circuitized substrate including at least one dielectric layer having first and second opposing surfaces, and first and second opposing conductive layers positioned on the first and second surfaces of the at least one dielectric layer, respectively, providing second and third circuitized substrates each including at least one dielectric layer and at least one conductive layer, forming first and second openings within these second and third circuitized substrates, respectively, positioning first and second cover members within the openings within the second and third circuitized substrates, respectively, aligning the first, second and third circuitized substrates relative to one another with the first opening of the second circuitized substrate having the first cover member therein facing the first opposing surface of the first circuitized substrate and the second opening of the third circuitized substrate having the second cover member therein facing the second opposing surface of said the circuitized substrate, bonding the first, second and third circuitized substrates together, and thereafter removing the first and second cover members to define first and second cavities within the second and third circuitized substrates, respectively, the first, second and third circuitized substrates forming a printed circuit board

BEST MODE FOR CARRYING OUT THE INVENTION

For a better understanding of the present invention, together with other and further objects, advantages and capabilities thereof, reference is made to the following disclosure and appended claims in connection with the above-described drawings. It is understood that like numerals will be used to indicate like elements from FIG. to FIG.

By the term "circuitized substrate" is meant a sub-part (or subassembly) capable of being bonded to one or more other such structures to form a PCB. Each circuitized substrate will include at least one dielectric layer and at least one conductive layer and, in one embodiment defined herein-below, at least one dielectric layer and two oppositely positioned conductive layers. By oppositely positioned is meant a conductive layer is positioned on one of the external surfaces (upper or lower), opposite the other. Examples of dielectric materials usable for such structures include fiberglass-reinforced epoxy resins (some referred to as "FR4" dielectric materials in the art, for the flame retardant rating of same), polytetrafluoroethylene (e.g., Teflon), polyimides, polyamides, cyanate resins, photo-imageable materials, and other like materials. Examples of conductor materials usable in the conductive layers include copper or copper alloys, but may include or comprise additional metals (e.g., nickel, aluminum, etc.) or alloys thereof. Such conductor materials are used to form conductive layers which may serve as power, signal and/or ground layers. If as a signal layer, several conductor lines and/or pads may constitute the layer, while if used as power or ground, such layers will typically be of substantially solid construction. Combinations of both signal and power and/or ground layers are possible. In the case of the circuitized substrate having two oppositely conductive layers, each layer is a signal layer with a plurality of spacedly positioned lines and/or pads thereon. Other dielectric layers which may be used between such substrates during the bonding procedure defined herein include what are known as "sticker sheets."

By the term "edge connector" as used herein is meant an electrical connector adapted for fitting onto the projecting edge of a printed circuit board. Typically, such edge connectors include an insulative housing and a plurality of spring contacts therein, said contacts aligned relative to an internal slot or the like opening into which the PCB edge is positioned, e.g., inserted. Each contact in turn is designed to mate with (e.g., in a sliding form of contact) a corresponding conductor pad or line on the PCB's opposite surfaces and/or projecting edge face.

By the term "printed circuit board" (or "PCB") as used herein-below is meant to include a multilayered structure comprised of three or more circuitized substrates bonded together.

Figure 1:
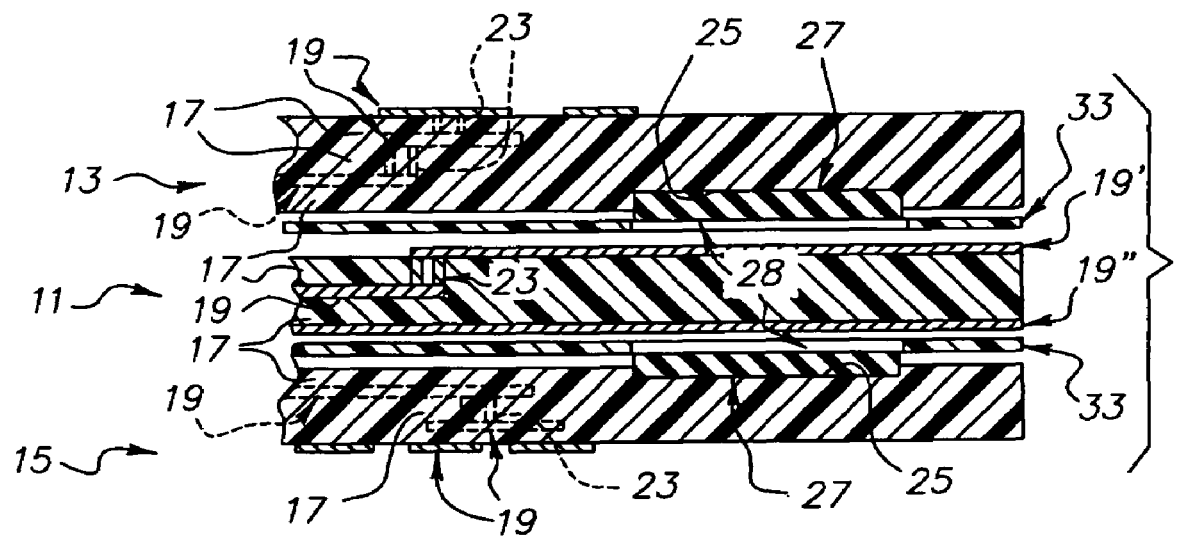
FIGS. 1-3 are enlarged, partial side elevational views, in section, illustrating the steps to forming a printed circuit board according to one embodiment of the invention.

In FIG. 1, three circuitized substrates (hereinafter also simply referred to as "substrates") are shown as being aligned relative to one another in a stacked orientation. A first substrate 11 is shown as positioned between oppositely positioned second and third substrates 13 and 15, respectively. As to be understood, at least three of such substrates are used to form a multilayered PCB according to the teachings herein. Understandably, more than three may be used, depending on the overall layer configuration desired for the final PCB. The invention is thus not limited to using only three substrates. Each circuitized substrate 11, 13 and 15 includes at least one dielectric layer 17 formed of a conventional dielectric material such as fiberglass-reinforced polymer resin (also known as FR4), polytetrafluoroethylene (Teflon), (a trademark of E.I. DuPont deNemours Company), Driclad dielectric material (Driclad is a registered trademark of the Assignee of this invention, Endicott Interconnect Technologies, Inc.), etc. In one embodiment, each dielectric layer 17 may possess a thickness within the range of from about one to five mils (a mil being 0.001 inch). Substrates 13 and 15 further include at least one conductive layer 19 located either within and/or upon the outer surface(s) of the substrate. In FIG. 1, substrates 13 and 15 include three conductive layers 19, and a similar number of dielectric layers 17. Each dielectric layer serves to insulate the respective conductive layers, as is conventionally done in PCB manufacture. Layers 19 are preferably copper or copper layer, known materials for PCB products, and may possess a thickness of from about 0.25 mils to about six mils. Layers 19 may function as signal, power or ground, depending again on product requirements. If a conductive layer is to serve as a signal layer, it will typically include several individual lines and/or pads as part thereof, as is indicated by the outer layers 19 for substrates 13 and 15.

Centrally disposed substrate 11 includes at least one dielectric layer (actually two are shown in the example in FIG. 1) and at least two outer conductor layers (referred to as 19' and 19" for ease of explanation), these being oppositely positioned (located on the opposing upper and lower outer surfaces of substrate 11). Substrate 11 may also include one or more internal conductor layers 19 (one shown in FIG. 1). Each outer conductor layer 19' and 19" is comprised of a plurality of individual signal lines and/or pads 21 (FIG. 5) which will be eventually located on the exposed outer surfaces of the projecting edge portion shown in FIG. 5 which is formed using the teachings herein. In the embodiment of FIG. 1, these signal lines and/or pads 21 extend at least from the approximate center of the substrate 11 to the farthest outer edge on the right side of the drawing. Lines 21 are preferably formed on the outer surfaces as shown using conventional photolithographic processing known in PCB manufacture. This is also true for the outer conductor layers 19 on substrates 13 and 15. If inner conductor layers are used for either substrate, then these are also preferably formed using conventional photolithographic processing with respect to a single dielectric layer on which the conductor material is positioned (e.g., laminated). Once circuitization has occurred, the respective dielectric layer-conductor layer sub-part is then laminated to other such sub-parts to form the desired circuitized substrate. As understood, however, the invention broadly applies to substrates with only one dielectric layer and one or more conductive layers, except for the interim substrate 11, which, as defined, includes at least two oppositely positioned conductive (signal) layers.

Each of the substrates 11, 13 and 15 may include thru-holes 23 as part thereof, e.g., to interconnect one or more of the conductor layers. Substrates 11 and 15 are shown as including one thru-hole 23 while substrate 13 includes two. The invention is not limited to this specific number or orientation, however. Such thru-holes may be formed using conventional thru-hole formation, preferably using a laser (e.g., an ultraviolet Nd:YAG laser) and then electroplating the hole walls with a suitable metallurgy. Either electro-less or electrolytic plating may be used to deposit the desired thickness of metal to serve as the conductive medium for the thru-hole. It is also possible to add conductive paste within the hole, or even to use it instead of the plating layers.

Significantly, substrates 13 and 15 each include an opening 25 within the outer surface thereof which faces the interim substrate 11. Openings 25 are preferably of rectangular configuration and, in one embodiment, possessed side and length dimensions of about 0.5 inches and five inches, respectively. Each opening also possesses a depth of about fifteen mils within the outer surface of the respective substrate. Within each opening 25 is positioned a cover member 27, of a similar size and shape configuration as the accommodating opening, and preferably slightly thicker to assure a frictional fit within its respective opening. Each cover 27 is preferably comprised of fluorosilicone rubber material, one example being sold under the trade name "DSP60FS" fluorosilicone sheeting by Diversified Silicone Products, Inc., of Santa Fe Springs, Calif. This material is extremely resistant to harsh chemicals, solvents and fluids and is capable of performing at temperature ranges of from as low as minus 54 degrees Celsius (C.) to as high as 260 degrees C. It also has a Shore "A" Durometer hardness rating of 60. The invention is not limited to using this particular material as others are possible, provided these offer the same important properties similar to those above. For example, suitable material is one known as "Viton." ("Viton" is a trademark of the E.I. DuPont deNemours & Company.) Viton is a fluoroelastomer and is known for its excellent (200° C.) heat resistance. It, like "DSP60FS" fluorosilicone above, offers excellent resistance to aggressive fuels and chemicals, and possesses a Shore "A" Durometer hardness rating of from about 65 to about 95, depending on the grade thereof. Viton sheets may be purchased from the Abbott Rubber Company, having a business address at 2143 Lunt Avenue Elk Grove Village, Ill. Another material suitable for the cover members of this invention is silicone rubber. Known high performance silicone rubber sheets are suitable for continuous use at temperatures from −60 degrees C. to as high as 218 degrees C.) and intermittent use from −75 degrees C. to even higher at 260 degrees C. Such sheets may be purchased from Ipotec, Inc., having a place of business at 41 Industrial Drive, Exeter, N.H.

Figure 2:
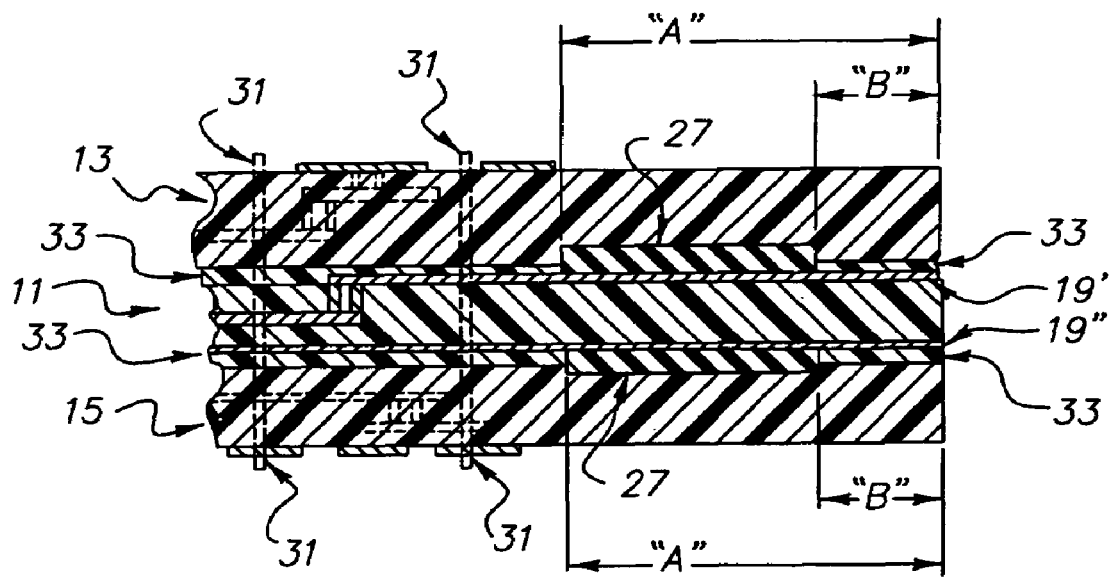

With each cover 27 in position, as shown, the aligned substrates 11, 13 and 15 are now bonded together to form a composite structure, as shown in FIG. 2. Pins 31 are preferably used to align the substrates. These pins (two are shown in phantom in FIG. 2 but many more may be utilized) extend through each of the substrates and are preferably of stainless steel. Bonding is accomplished preferably using a lamination process, and, in the example using the three substrates as shown, at a temperature within the range of from about 150 degrees C. to about 250 degrees C., over a time period of from about 60 minutes to about 120 minutes. As a result of the relatively high compressive forces on the respective substrates during such processing, dielectric material of one or more of the substrates, being in heated, flowable state, may migrate. The cover members 27 function to prevent the dielectric from engaging the exposed conductors 21 of the conductive layers 19' and 19" of center substrate 11. This is because the cover members are compressed against said conductors with sufficient force to prevent such migration. Significantly, cover members 27 are capable of preventing such migration even when using interim dielectric "sticker sheets" 33. These sheets, also referred to in the art simply as "prepreg" sheets, are conventionally used in lamination of substrates such as those shown above. These are also preferably used in the present invention, but such usage is not mandatory. When used with the other elements defined above, these sticker sheets possessed a thickness of from about 1.5 mils to about five mils. Prior to positioning between the respective substrates as shown, each sheet is cut to remove sections thereof similar in dimensions as the cover members 27. Such openings 28 are shown in FIG. 1. When such sheets are used, the thickness of the respective cover members is approximately 0.005 inch (five mils) greater than the combined thickness (depth) of the respective opening 25 housing the cover member 27 and the associated sticker sheet 33. Such a relative thickness is deemed important for the reasons explained below.

It has been determined that when using the aforementioned fluorosilicone material is utilized at such relative thicknesses, a firm seal is formed over the individual signal conductors 21 of each conductive layer 19' and 19", despite the relatively harsh pressures and temperature incurred during the lamination process. Quite unobvious, there is no migration of dielectric from either the dielectric layers of either substrate or from the sticker sheets (which also become flowable when heated) onto the conductors 21. This is deemed entirely unobvious because of the known fact that the sticker sheets and dielectric layers will each compress to a lesser thickness due to such high pressures, as will the fluorosilicone cover members. By carefully identifying a critical thickness for the cover members, and using a material having such features as defined above, in combination with the other materials and thicknesses cited herein, however, such a firm seal has resulted.

Figure 3:
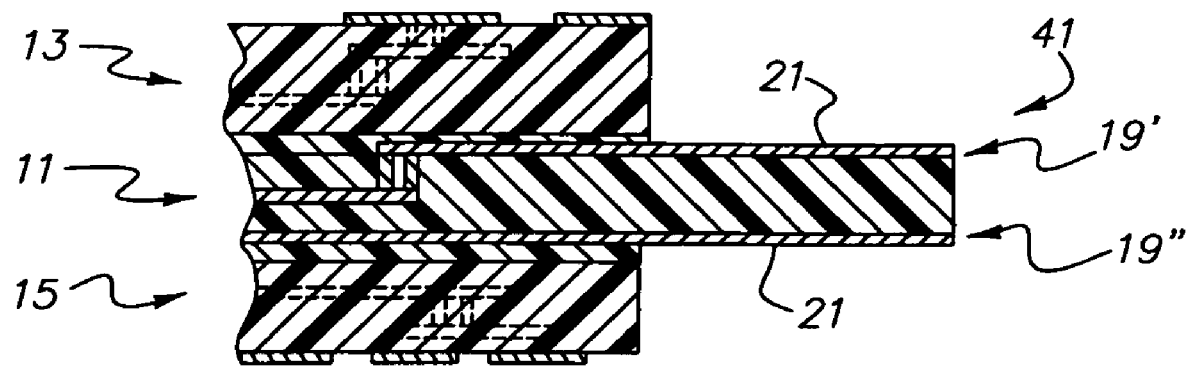
Figure 4:
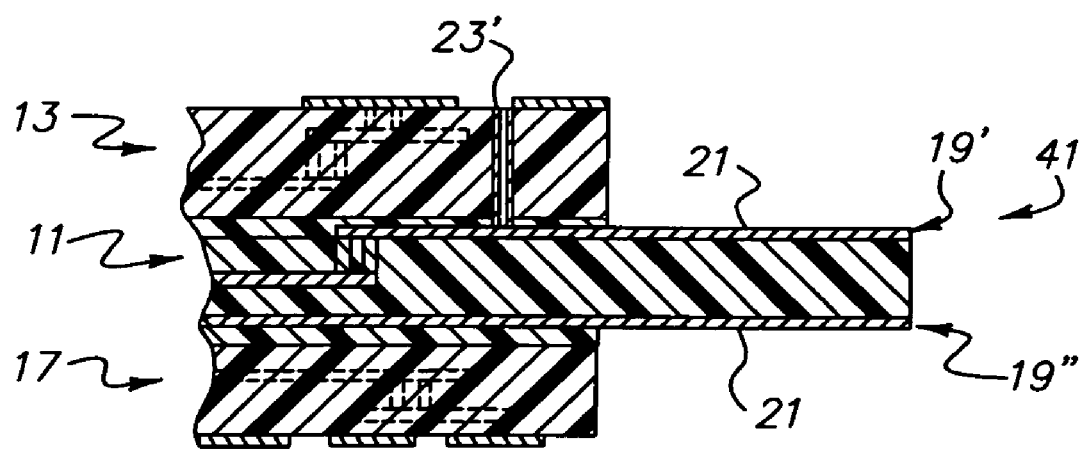
FIG. 4 is an enlarged, partial side elevational view, in section, illustrating at least one of the additional steps which may be performed on the structure of FIG. 3.
Figure 5:
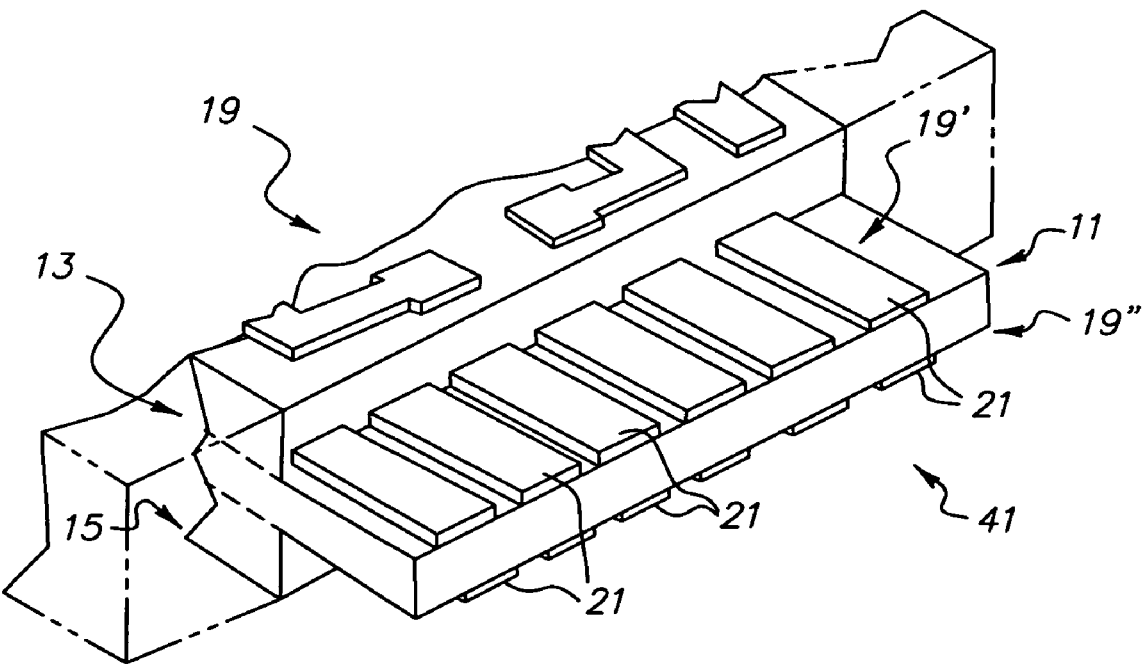
FIG. 5 is an enlarged, partial perspective view showing one embodiment of an edge portion which may be formed on a printed circuit board according to the teachings of the instant invention, with an alternative embodiment being shown in phantom.

The bonded structure of FIG. 2 is now subjected to further processing to produce a projecting edge portion 41, as shown in FIG. 3 (and FIG. 5). In one embodiment, this processing involves using a milling tool (not shown) to mill down selected portions of the outer substrates 13 and 15 and the respective cover members 27. Other means than milling may be utilized, but milling has proven to be the more preferred approach. In one such process, the entire outer portion (represented by dimension "A" in FIG. 2) of substrates 13 and 15 is removed. Milling is also used in this particular approach to remove the end portion of interim substrate 11, as represented by the dimension "B" in FIG. 2. Other approaches are possible. For example, it might be possible to only remove portions of substrates 13 and 15 and leave the extending end represented by dimension "B" of substrate 11. This is possible should the edge connector designed to be positioned on such an edge will have sufficiently long enough contacts to reach the exposed conductors 21 while the covered (with dielectric) end portions remain in place. The embodiment of FIGS. 3 and 5 is one in which the outer end portion (dimension "B") of substrate 11 is removed. Yet another approach will be defined below with respect to the FIG. 7 embodiment.

The structure of FIG. 3 is now capable of being further processed, including adding more thru-holes 23' (one shown in FIG. 3) from the outer surfaces of the multilayered structure to selected conductor layers therein. It is also possible to form thru-holes which extend entirely through the full thickness of the structure. It is further possible to provide additional metallurgy onto the now exposed conductors 21 on the projecting edge portion. Examples of such metallurgy include nickel and gold, the latter being a precious metal highly desirable for assuring enhanced conductivity. The extending, openly exposed conductors facilitate the processing, e.g., electroplating such an electro-less or electrolytic plating, to add such metallurgy.

The embodiment of FIG. 5 represents two examples of projecting edge portions which may be formed using the teachings herein. In one example, the edge portion 41 may extend the full width of the PCB, as represented by the solid lines in FIG. 5. Alternatively, the projecting edge portion may only occupy a portion of the full width, as represented by the phantom lines in FIG. 5. In the case of the latter embodiment, the projecting edge portion may be centrally oriented relative to the board's overall width, or be offset. The invention is thus able to provide a PCB with more than one possible projecting edge location.

Figure 6:
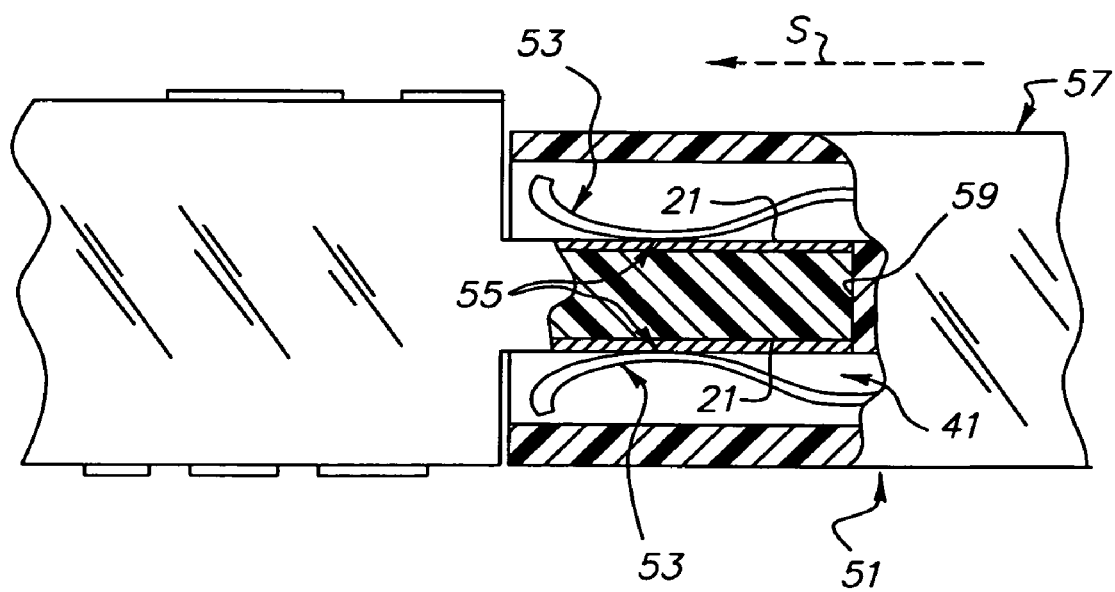
FIG. 6 is a partial side elevational view, only partly in section, showing the edge portion of the printed circuit board of FIG. 3 having an edge connector positioned thereon and electrically coupled to the board.

In FIG. 6, the PCB with the projecting edge portion as shown in FIG. 5 is shown having an edge connector 51. Connector 51 includes a plurality of spring contacts 53 with curvilinear contacting segments 55 which slidably engage the conductors 21. Each conductor may be contacted by a corresponding spring contact, and thus more than two such contacts 53 are utilized. Contacts 53 are seated within a base portion of an insulative, e.g., phenolic, housing 57. Connector 51 is slidably positioned (along direction "S") until the edge of portion 41 engages a stop portion 59 of housing 57. The connector shown in FIG. 6 is not meant to limit the invention, however, as many different forms of such connectors are possible.

Figure 7:
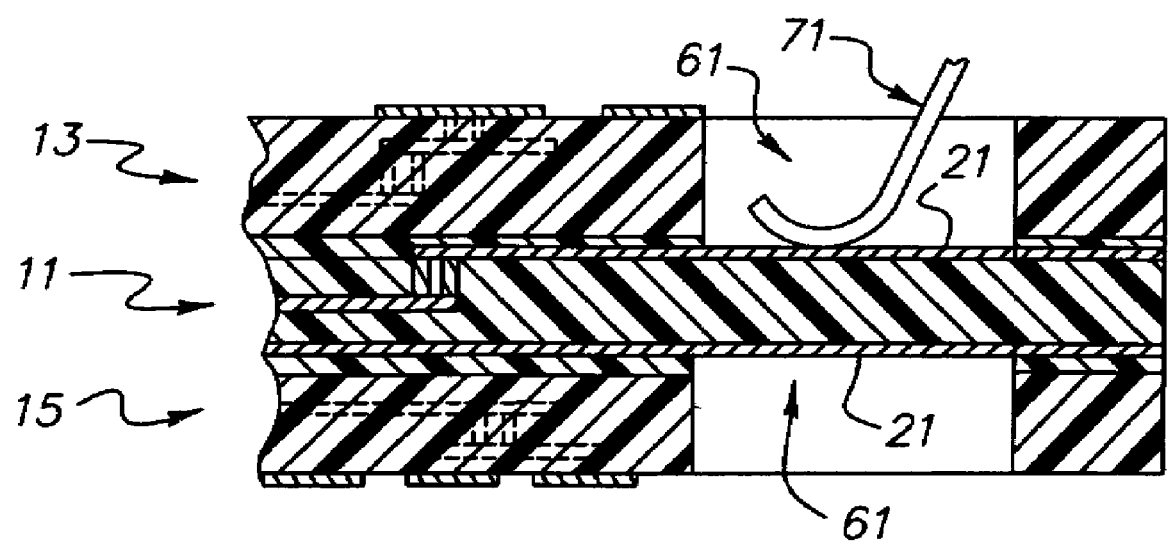
FIG. 7 is a partial side elevational view, in section, showing the formation of two cavities within the printed circuit board of the invention, which may also be accomplished utilizing the teachings herein.

FIG. 7, as mentioned above, represents an alternative embodiment of the invention. More specifically, the PCB of FIG. 7 includes a pair of cavities 61 instead of an exposed projecting edge portion as shown in FIGS. 3-6. Cavities 61 are formed using a milling tool similarly as was used in the FIG. 2 embodiment, except that milling only occurs over the portion of the substrates 13 and 15 designed to house cover members 27. That is, milling of these two substrates occurs only down to the cover members and along vertical dimensions similar to those of the cover members, Thus only the members are removed (in addition to only the portions of the substrates 13 and 15 above same) but the outer portions (represented by the dimension "B" in FIG. 2) of all three substrates are not removed. The exposed conductors 21 may then be engaged by contacts 71 (only one shown in FIG. 7) which protrude within the cavities. As with contacts 53, more than one contact 71 is used per side of the connector, such that each conductor 21 is engaged by a single contact 71. The connector remainder may also include an electrically insulating housing (not shown) and other elements known for such connectors, and further description is not deemed necessary. The cavities formed may be of any desired shape, including rectangular (most preferred), and may also extend the full width of the PCB. As with edge portion 41, however, each cavity may only occupy a portion of the full width, e.g., be centrally located between two opposing ends of the PCB. It is also within the scope of this invention to provide both projecting edge portions and cavities within a single PCB, as the invention is not limited to either edge portions or cavities. Multiple cavities of different depths within the same board, or even cavities with different depths within one cavity can also be formed.

Thus there has been shown and described a new and unique method of making a printed circuit board with a projecting edge portion and/or a plurality of cavities therein designed to accommodate an external connector so as to make contact with conductors of the board. The methods as taught herein are able to utilize existing PCB manufacturing equipment and processes in addition to using the selected cover members for the purposes intended. The invention thus represents a significant improvement in the art.

While there have been shown and described what are at present the preferred embodiments of the invention, it will be obvious to those skilled in the art that various changes and modifications may be made therein without departing from the scope of the invention as defined by the appended claims.

What is claimed is:

1. A method of making a printed circuit board, said method comprising:
   providing a first circuitized substrate including at least one dielectric layer having first and second opposing surfaces, and first and second opposing conductive layers positioned on said first and second surfaces of said at least one dielectric layer, respectively;
   providing second and third circuitized substrates each including at least one dielectric layer and at least one conductive layer;
   forming first and second openings within said second and third circuitized substrates, respectively;
   positioning first and second cover members within said first and second openings within said second and third circuitized substrates, respectively;
   aligning said first, second and third circuitized substrates relative to one another with said first opening of said second circuitized substrate having said first cover member therein facing said first opposing surface of said first circuitized substrate and said second opening of said third circuitized substrate having said second cover member therein facing said second opposing surface of said first circuitized substrate;
   bonding said first, second and third circuitized substrates together; and
   thereafter removing said first and second cover members to define first and second cavities within said second and third circuitized substrates, respectively, said first, second and third circuitized substrates forming a printed circuit board.

2. The method of claim 1 wherein said forming of said first and second openings within said second and third circuitized substrates, respectively, is accomplished using a milling operation.

3. The method of claim 1 wherein said first and second openings formed within said second and third circuitized substrates, respectively, are formed to a predetermined depth within said second and third circuitized substrates, respectively.

4. The method of claim 1 wherein said aligning of said first, second and third circuitized substrates relative to one another is accomplished utilizing a plurality of pins, said pins extending through each of said first, second and third circuitized substrates.

5. The method of claim 1 wherein said bonding of said first, second and third circuitized substrates together is accomplished utilizing a lamination process.

6. The method of claim 5 wherein said lamination process is accomplished at a temperature within the range of from about 150 degrees C. to about 250 degrees C. for a time period of from about 60 minutes to about 120 minutes.

7. The method of claim 1 wherein said removing of said first and second cover members to define said cavities is accomplished utilizing a milling operation.

8. The method of claim 1 further including positioning a first dielectric layer between said first and second circuitized substrates and a second dielectric layer between said first and third circuitized substrates prior to said bonding of said first, second and third circuitized substrates together.

9. The method of claim 8 further including removing selected portions of said first and second dielectric layers prior to said bonding of said first, second and third circuitized substrates together, said selected portions of said first and second dielectric layers having length and width dimensions substantially similar to the length and width dimensions of said first and second cover members, respectively.

10. The method of claim 1 further including positioning an edge connector on said printed circuit board to electrically couple said edge connector to said first circuitized substrate through said first and second cavities.

* * * * *